Feb. 10, 1959 E. S. RITTNER 2,873,303

PHOTOVOLTAIC DEVICE

Filed Nov. 1, 1954

INVENTOR
EDMUND S. RITTNER
BY [signature]
AGENT

United States Patent Office 2,873,303

Patented Feb. 10, 1959

2,873,303

PHOTOVOLTAIC DEVICE

Edmund S. Rittner, White Plains, N. Y., assignor to North American Philips Company, Inc., New York, N. Y., a corporation of Delaware Application November 1, 1954, Serial No. 466,010

4 Claims. (Cl. 136—89)

My invention relates to devices capable of generating electric currents in response to the impinging thereon of radiation in the visible region of the spectrum.

As my invention is particularly useful in connection with the conversion of solar energy, I shall describe the same in this connection. However, the invention extends to other types of photosensitive devices, such as exposure meters for photographic use and photo-electric cells.

It has recently been proposed to convert solar radiation into electrical power by means of a silicon p-n junction photocell formed of a thin layer of p-type silicon on an n-type base. While such photocells have a much higher efficiency for solar energy conversion than photovoltaic cells previously available, the efficiency is still below the desired value.

The main object of my invention is to increase the efficiency of such devices and I have found it possible to achieve this purpose by employing aluminum antimonide instead of the materials previously used, which materials in addition to silicon include germanium, cadmium sulphide, selenium and cuprous oxide.

In accordance with my invention, I form the photovoltaic cell of two portions of aluminum antimonide (AlSb) in intimate contact; one of the portions being of p-type and the other being of n-type material. One of these portions, which has a surface adapted to receive the radiation, is given a thickness smaller than the minority carrier diffusion length.

Figure 1:
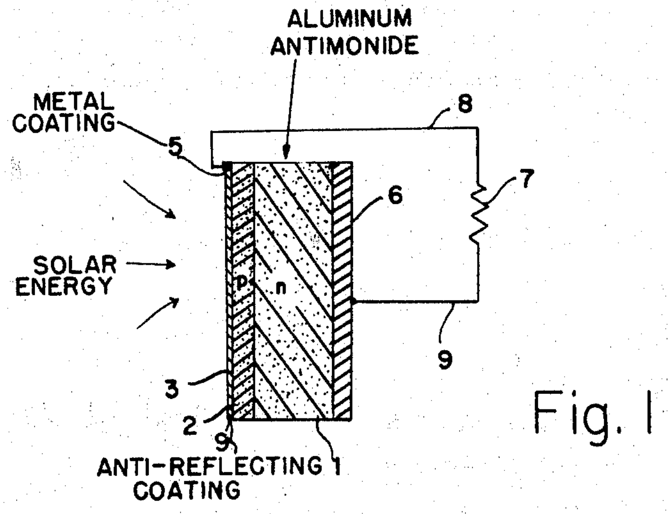
Figure 2:
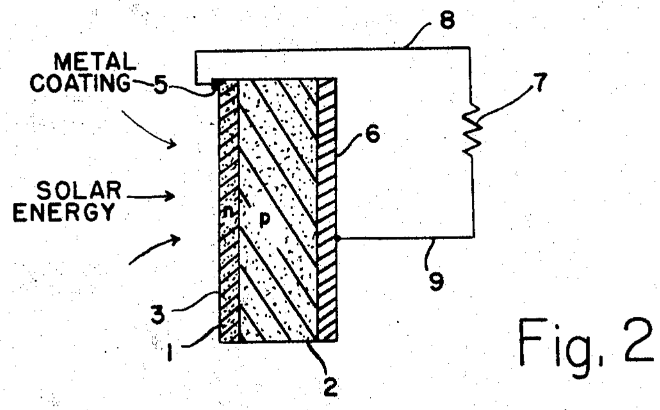

In order that the invention may be clearly understood and readily carried into effect, I shall describe the same in more detail with reference to the accompanying drawing, in which:

Figure 1 shows in section a p-n junction photovoltaic device according to the invention with an appropriate load circuit, and Fig. 2 is a sectional view of another embodiment of the invention.

The photovoltaic device shown in Fig. 1, which may serve to convert solar radiation into electrical energy, comprises an n-type portion 1 in intimate contact with a p-type portion 2, both portions being of aluminum antimonide (AlSb). The aluminum antimonide is treated in any of the ways known in the art to make it p- or n-type. For example, p-type material may be prepared by adding a stoichiometric excess of Al to the compound and similarly the use of excess Sb produces n-type material.

The p-type portion 2 has a surface 3 adapted to receive radiation in the visible region of the spectrum (as indicated). To realize the full efficiency of which the device is capable, I prefer to provide an anti-reflecting coating 9 upon the surface 3. Such a coating may consist, for example, of a film about 0.1 micron thick of ethyl cellulose or of vinyl polyester styrene copolymer. Portion 2 is given a thickness less than the minority carrier diffusion length, i. e., less than $\sqrt{D\tau}$ in which D represents the diffusion coefficient of the minority carrier and $\tau$ represents its lifetime. As a rule, such thickness is less than about 0.001 inch.

In order to make good electric connections to the portions 1 and 2, I provide thereon thin metallic coatings 5 and 6 respectively which may be cured silver paste, a vapor- or electro-deposited metal coating or the like. As shown, the coating 5 forms a single ohmic connection of small area and of low resistance. In cases where the area of surface 3 is large I prefer to use a plurality of small area contacts distributed over the surface.

As shown in the drawing, the power generated in the device is consumed by an electrical load resistance 7 which has its terminals connected by conductors 8 and 9 to the coatings 5 and 6, respectively.

The device shown in Fig. 2 is similar to that of Fig. 1 and the same parts are indicated by the same reference numerals. However, in Fig. 2 the n-type layer 1 of aluminum antimonide has the light-receiving surface and is made thin, as described above.

If devices of the types shown in Figs. 1 and 2 are used as photoelectric cells with modulated light signals, I prefer to insert a battery in series with the resistance 7 in such manner as will bias the p-n junction in the reverse direction.

One example of an embodiment like that of Fig. 1 is as follows: In layer 2, there was an excess of Al of about $10^{18}$ atoms/cm.$^3$. In layer 1, there was an excess of Sb of about $10^{18}$ atoms/cm.$^3$. For a D of 10 cm.$^2$/sec. and $\tau$ of $10^{-6}$ sec., the width of the layer 2 is about .001 inch. A suitable load resistor 7 for a surface area 3 of about 1 sq. cm. is about 50 ohms.

While I have described my invention in connection with specific examples, I do not desire to be limited thereto as obvious modifications will readily present themselves to one skilled in this art.

What I claim is:

1. As a photovoltaic solar energy converter, a p-type portion of semi-conductive aluminum antimonide containing about $10^{18}$ atoms/cm.$^3$ of p-type producing elements and an n-type portion of semi-conductive aluminum antimonide containing about $10^{18}$ atoms/cm.$^3$ of n-type producing elements in intimate contact with one another and forming a p-n junction therebetween, and electrical connections to said p- and n-type portions, one of said portions having a surface area adapted to receive solar energy, the thickness of said one portion underlying said receiving surface being less than the minority carrier diffusion length in said one portion.

2. A solar energy converter as set forth in claim 1 wherein a load impedance providing a large power output is connected across the electrical connections to the p- and n-type portions.

3. As a photovoltaic solar energy converter, a p-type portion of semi-conductive aluminum antimonide and an n-type portion of semi-conductive aluminum antimonide in intimate contact with one another and forming a p-n junction therebetween, electrical connections to said p- and n-type portions, one of said portions having a surface area adapted to receive solar energy, the thickness of said one portion underlying said receiving surface being less than the minority carrier diffusion length in said one portion, and an anti-reflecting coating constituted of an organic resin film on said receiving surface.

4. A solar energy converter as set forth in claim 3, wherein the connection to said one portion is a small-area ohmic contact, and the connection to the other portion is a large-area ohmic contact.

(References on following page)

References Cited in the file of this patent

UNITED STATES PATENTS

| | | |
|---|---|---|
| 2,402,582 | Scaff | June 25, 1946 |
| 2,402,662 | Ohl | June 25, 1946 |
| 2,522,987 | Buck | Sept. 19, 1950 |
| 2,644,852 | Dunlap | July 7, 1953 |
| 2,669,635 | Pfann | Feb. 16, 1954 |
| 2,780,765 | Chapin et al. | Feb. 5, 1957 |

FOREIGN PATENTS

| | | |
|---|---|---|
| 1,057,038 | France | Oct. 28, 1953 |

OTHER REFERENCES

Metal Industry, Dec. 18, 1953, page 506.

"Light Metal Age," August 1953, pages 11 and 28, article by Lewis.

Shockley, W.: "Electrons and Holes in Semi-Conductors," D. Van Nostrand Co., Princeton, N. J., 1950, pp. 114–115.